United States Patent [19]

Delagebeaudeuf et al.

[11] 4,455,564
[45] Jun. 19, 1984

[54] FIELD EFFECT TRANSISTOR WITH A HIGH CUT-OFF FREQUENCY

[75] Inventors: Daniel Delagebeaudeuf; Trong L. Nuyen, both of Paris, France

[73] Assignee: Thomson-CSF, Paris, France

[21] Appl. No.: 501,552

[22] Filed: Jun. 9, 1983

Related U.S. Application Data

[63] Continuation of Ser. No. 181,646, Aug. 26, 1980.

[30] Foreign Application Priority Data

Sep. 10, 1979 [FR] France .............................. 79 22586

[51] Int. Cl.³ .............................................. H01L 29/80
[52] U.S. Cl. ........................................ 357/22; 357/15; 357/16; 357/61
[58] Field of Search .................. 357/15, 16, 22, 61

[56] References Cited

U.S. PATENT DOCUMENTS 4,157,556  6/1979  Decker et al. ........................ 357/22

Primary Examiner—Edward J. Wojciechowicz

[57] ABSTRACT

The invention relates to semiconductor devices of the transistor type operating at high frequencies.

In order to make the drain/source current characteristic linear with the voltage applied to the grid and in order to retain a construction technology which is compatible with existing technologies the invention provides an $Al_xGa_{1-x}As$ layer between the substrate and the active GaAs layer. A supplementary, highly doped, GaAs layer and a supplementary semi-insulating $Al_xGa_{1-x}As$ layer modify the source and drain access resistances and the output resistance.

Application to devices operating at ultra-high frequencies.

5 Claims, 6 Drawing Figures

FIELD EFFECT TRANSISTOR WITH A HIGH CUT-OFF FREQUENCY

This application is a continuation of application Ser. No. 181,646, filed Aug. 26, 1980 and now abandoned.

BACKGROUND OF THE INVENTION

The present invention relates to improvements to semiconductor devices of the field effect transistor type and more specifically relates to those with a high cut-off frequency.

A field effect semiconductor device has been described in which a semi-insulating substrate supports the source and drain regions on the one hand and an active GaAs layer and and $Al_xGa_{1-x}As$ grid forming a heterojunction with the active layer on the other hand. In this type of transistor x is between 0.1 and 0.8 and to simplify both text and drawings $Al_xGa_{1-x}As$ is replaced by AlGaAs.

This device has been produced in several forms, depending on whether the active layer is of:
N-type weakly doped GaAs,
P-type weakly doped GaAs,
or whether the grid is of:
AlGaAs covered or not covered with an oxide layer.

All these constructions have the following common characteristics:
a high mobility electron layer in the heterojunction interface zone on the GaAs side,
the electron concentration of this layer is controlled by the polarization of the AlGaAs grid, which may or may not be covered by oxide.

The advantage of these devices compared with known field effect transistors is due to the great mobility of the electrons in the interface layer—metal Schottky field effect transistor and MOS (metal/oxide/silicon) transistor with depletion or inversion which have a reduced electron mobility. However, there are limitations on the load control by the AlGaAs grid.

Firstly the controlled load, i.e. the current between the source and drain $I_{DS}$ varies with the square root of the voltage applied to the grid $V_G$. In other words the characteristics $I_{DS}/V_G$ are not linear. These non-linear characteristics also exist in MESFET or MOSFET transistors. This is not a serious disadvantage, but from the use standpoint it is more advantageous to make them linear. For this reason in MESFET transistors linearization is sought and sometimes obtained in a relatively complicated manner by the formation of an active layer with variable doping profile.

Moreover, the concept of the load control by the AlGaAs grid leads to special transistor construction differing from those of conventional MESFET transistors, particularly due to the technology of the grid, drain and source contacts. Thus, their manufacture requires a different technology from that of GaAs MESFET, making their industrial production more difficult.

BRIEF SUMMARY OF THE INVENTION

The object of the present invention is to obviate these disadvantages by the use of the heterojunction between the GaAs and AlGaAs layers to create a high mobility electron accumulation layer and a Schottky grid to control this load.

More specifically the invention relates to a field effect transistor with a high cut-off frequency having, supported by a semi-insulating substrate, two access regions called the source and the drain and one control region formed by a metal grid called a Schottky grid and an active layer, wherein an N—N isotype heterojunction is formed between the weakly doped GaAs active layer (N below $10^{16}$ electrons/cm$^3$) and a $Al_xGa_{1-x}As$ layer doped with $5.10^{16}$ to $10^{18}$ electrons/cm$^3$, for which x is between 0.1 and 0.8, said $Al_xGa_{1-x}As$ layer being located between the substrate and the active layer.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
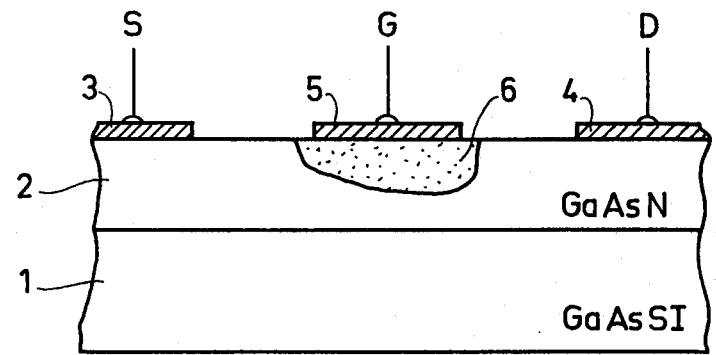
FIG. 1 a diagrammatic section of a prior art MESFET.

FIG. 1 is a diagrammatic section through a prior art MESFET transistor. A GaAs layer 2 of the N-type and with doping of approximately $10^{17}$ cm$^3$ is deposited on a semi-insulating GaAs substrate 1. The source electrode 3, drain electrode 4 and grid electrode 5 are obtained by metal coating. Under the action of a negative control voltage on grid 5 an electron-free zone 6 is created. The electrons are thus pinched-off in a channel defined by the deserted zone 6 and the semi-insulating substrate 1. Due to the doping rate in the GaAs layer 2 the mobility, i.e. the displacement speed of the electrons in the channel is low.

Figure 2:
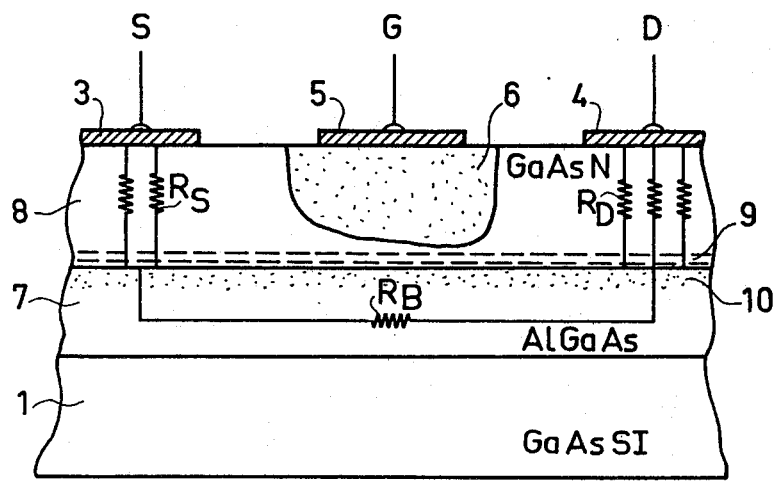
FIG. 2 a diagrammatic section of a FET with heterojunction and Schottky grid according to the invention.

FIG. 2 shows a diagram of a transistor with a heterojunction and Schottky grid according to the invention and which can be called a heterojunction MESFET transistor. An AlGaAs layer 7 doped to a level higher than $10^{17}$ electrons/cm$^3$ and a GaAs layer 8 of the N-type weakly doped to a level of $10^{15}$ electrons/cm$^3$ are successively deposited on a semi-insulating GaAs substrate 1. The source electrode 3, drain electrode 4 and grid electrode 5 are deposited and positioned as in a conventional MESFET. The electron accumulation zone 9 created by the GaAs/AlGaAs heterojunction is located in the GaAs layer 8 in the vicinity of the junction. By polarization of Schottky grid 5 the thickness of the deserted zone 6 can be modified, as can the load accumulated at the interface in zone 9. An electron-free zone 10 located in the AlGaAs layer 7 in the vicinity of the heterojunction corresponds to zone 9.

Figure 3:
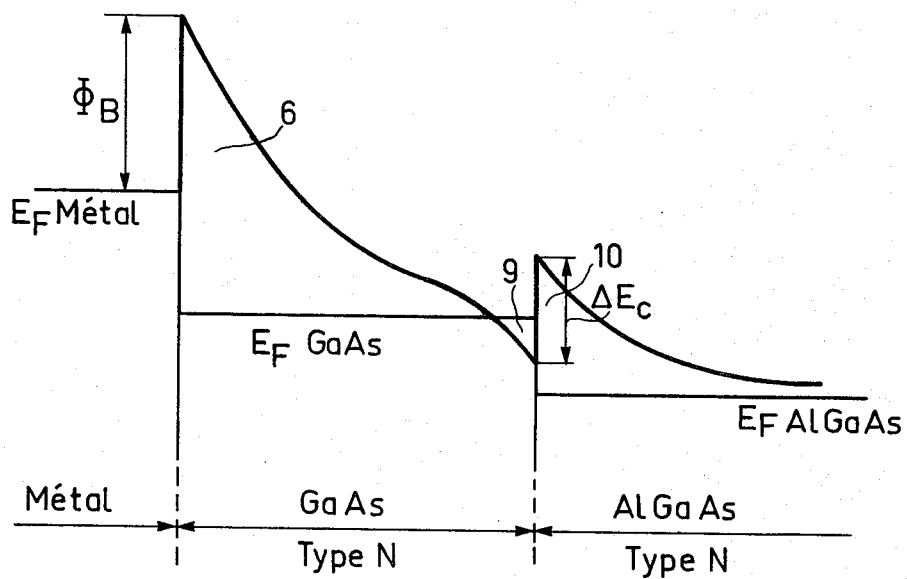
FIG. 3 a diagram of a construction incorporating a GaAs heterojunction of the N/AlGaAs type and a Schottky junction.

FIG. 3 is the constructional diagram of the metal Schottky grid/GaAs of the weakly doped N-type/AlGaAs of the N-type, with negative polarization of the Schottky grid and in which:
$E_F$ designates the Fermi level,
$\phi_B$ designates the height of the Schottky barrier, $\Delta E_C$ designates the break in the conduction band at the heterojunction interface which represents the height of the barrier for the electrons at the heterojunction interface.

The curves of the GaAs band show the electron-free zone 6 at the interface with the Schottky grid and the electron-accumulation zone 9 at the interface with AlGaAs. The curvature of the bank in AlGaAs shows the electron-free zone 10 in AlGaAs in the vicinity of the interface with GaAs. The negative polarization of the Schottky grid extends the deserted area 6 and for a sufficiently high voltage value area 6 extends up to the interface with AlGaAs. This voltage is identical to the pinch-off voltage in a conventional MESFET transistor and is dependent on the doping and thickness of the GaAs layer 8, the doping of the AlGaAs layer 7 and the aluminium concentration in the AlGaAs.

Moreover, the variation of the accumulated load of area 9 under the action of the polarization of the Schottky grid 5 which modifies the thickness of the deserted area 6 is a linear function of the voltage of this polarization.

Thus, a transistor in accordance with FIG. 2 has the desired properties, i.e. linear $I_{DS}-V_G$ characteristics and a technology of the source, drain and grid contacts close to that of the conventional MESFET. However, it still has limitations.

1. The thickness of the N-type, weakly doped GaAs layer 8 ($\sim 10^{15}$ electrons/cm$^3$) must be approximately 1 micron, because at this doping level the thickness of the deserted area 6 with zero polarization is of this order of magnitude. However, this thickness leads to the low transconductance of the device compared with conventional MESFET transistors and to high access resistances of source $R_S$ and drain $R_D$.

2. As the AlGaAs layer 7 is doped to a level above $10^{17}$ electrons/cm$^3$ the tunnel effect between GaAs and AlGaAs can be great. Moreover, this layer has a limited resistance as it is doped to $10^{17}$ electrons/cm$^3$, so that there is a low parallel output resistance $R_B$ between the source and the drain.

3. Due to the existence of an electron-free area 10 at the heterojunction interface on the GaAs side stray capacitances appear, which have the effect of limiting the performances of the transistor.

Figure 4:
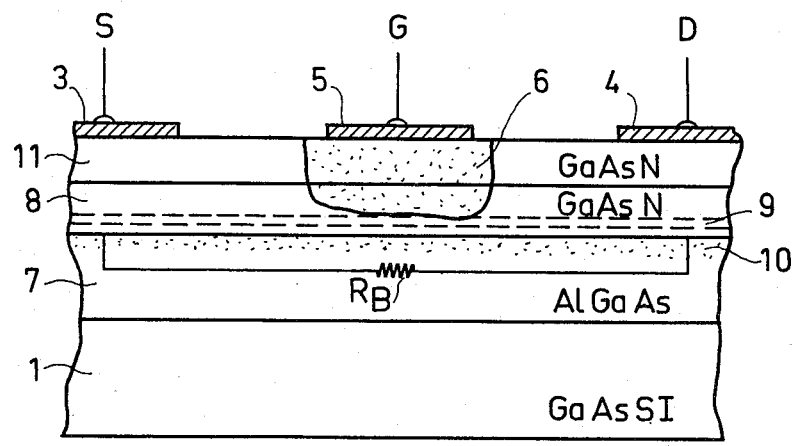
FIG. 4 a diagrammatic section of a first embodiment of a heterojunction FET and a Schottky grid according to the invention.
Figure 5:
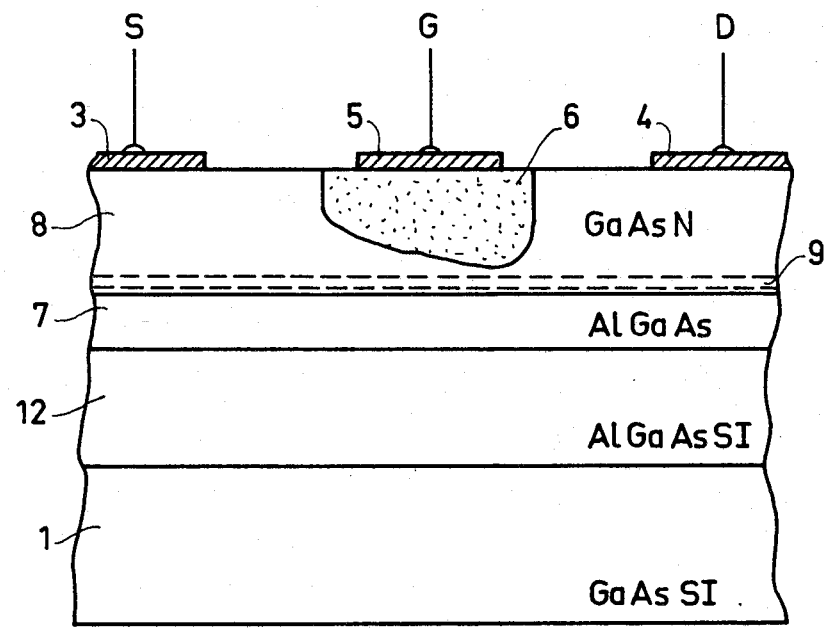
FIG. 5 a diagrammatic section of a second embodiment of an FET according to the invention.

These three limitations can be obviated by the constructions described relative to FIGS. 4 and 5.

FIG. 4 shows a construction making it possible to increase the transconductance of the device and to reduce the stray resistances $R_S$ and $R_D$. As in FIG. 2 the transistor has a semi-insulating substrate 1, a source 3, a drain 4, a grid 5 creating a deserted area 6, an AlGaAs layer 7 and an N-type, weakly doped GaAs layer 8. However, GaAs layer 8 has a limited thickness (500 to 1000 Å) and is associated with an N-type, GaAs layer 11 doped to approximately 1 to $5.10^{17}$ electrons/cm$^3$ and with a thickness of approximately 500 to 1000 Å. The metal coatings of the electrodes are deposited on layer 11. As the electron-accumulation layer 9 has the thickness of approximately 500 Å the stray resistances $R_S$ and $R_D$ are reduced in proportions from $10^{-1}$ to $10^{-4}$ compared with the structure proposed in FIG. 2. Bearing in mind the overall thickness of the two superimposed layers 8 and 11 the transconductance is improved by a factor of 6 to 10 compared with the construction of FIG. 2.

FIG. 5 shows a construction making it possible to increase the parallel output resistance $R_B$ and to obviate stray capacitances. The transistor has a semi-insulating substrate 1, a source 3, a drain 4, a grid 5 creating a deserted area 6, an N-type, AlGaAs layer 7 doped to a level above $10^{17}$ electrons/cm$^3$ and a weakly doped, N-type GaAs layer 8. However, the AlGaAs layer 7 has a limited thickness of approximately 500 to 1000 Å and a semi-insulating AlGaAs layer 12 is placed between the semi-insulating GaAs substrate 1 and the doped AlGaAs layer 7. The thickness of the AlGaAs layer 7 is limited so that it is substantially equal to the thickness of the electron-free area 10 in the AlGaAs at the heterojunction interface. As area 10 is free from electrons it has a high resistivity. Thus, between the semi-insulating substrate 1 and accumulation area 9 the structure has a high resistivity. This has the effect of increasing the parallel output resistance $R_B$. Due to the absence of conduction in the AlGaAs layer 7 the stray capacitances are eliminated and compared with a construction according to FIG. 2 or 4 the resistance $R_B$ and the stray capacitances are reduced by a factor exceeding $10^3$.

Figure 6:
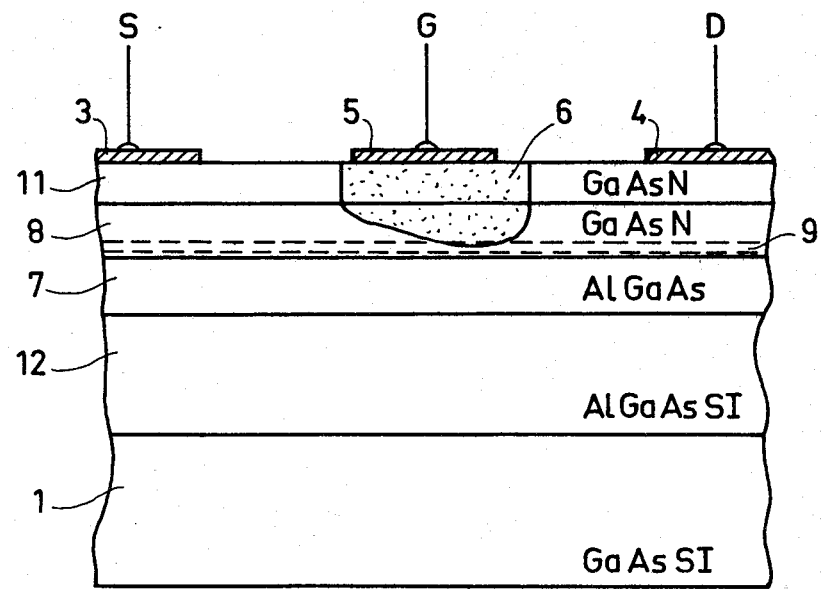
FIG. 6 a diagrammatic section of a third embodiment of an FET according to the invention.

FIG. 6 shows a heterojunction field effect transistor in which the different partial constructions described relative to FIGS. 4 and 5 are combined. Thus, this transistor is constituted by all the layers described starting from the substrate and extending to the electrodes:

1: semi-insulating GaAs substrate,
12: high resistivity, semi-insulating AlGaAs,
7: N-type AlGaAs doped to a level of approximately $10^{17}$ electrons/cm$^3$,
8: N-type GaAs doped to $10^{15}$ electrons/cm$^3$,
11: GaAs doped to $10^{17}$ electrons/cm$^3$,
3, 4, 5: source, drain and grid electrodes respectively.

What is claimed is:

1. A field effect transistor with a high cut-off frequency having, supported by a semi-insulating substrate, two access regions called the source and the drain and one control region formed by a metal grid called a Schottky grid, said transistor further comprising an active layer of weakly doped GaAs (N below $10^{16}$ electron/cm$^3$) and a $Al_xGa_{1-x}As$ layer doped with $5.10^{16}$ to $10^{18}$ electrons/cm$^3$, there being an N—N isotype heterojunction formed between said active layer and said $Al_xGa_{1-x}As$ layer with a depletion region in said active layer wherein x is between 0.1 and 0.8, said $Al_xGa_{1-x}As$ layer being located between the substrate and the active layer, the active layer having a thickness of approximately one micron and being approximately equal to the thickness of said depletion region to provide a high frequency response.

2. A field effect transistor according to claim 1, wherein the area located in the vicinity of the heterojunction on the side of the GaAs layer constitutes an area of high electron mobility and the electron concentration in this area can be modified by the voltage applied to the grid, the electronic load accumulated in the area having a linear relationship with the voltage applied to the grid.

3. A field effect transistor according to claims 1 or 2, wherein its transconductance is increased and the access resistances to the source and to the drain decrease by adding between the grid and the active GaAs layer of thickness 500 to 1000 Å a second GaAs layer of the N-type, doped between $10^{17}$ and $5.10^{17}$ electrons/cm$^3$ and with a thickness between 500 and 1000 Å.

4. A field effect transistor according to claims 1 or 2, wherein the parallel output resistance between the source and the drain is increased and the effects of stray capacitances between the layers reduced by adding a second semi-insulating $Al_xGa_{1-x}As$ layer between the substrate and the $Al_xGa_{1-x}As$ layer of thickness between 500 and 1000 Å.

5. A field effect transistor according to claim 1, wherein it comprises, deposited on a semi-insulating substrate successively a semi-insulating $Al_xGa_{1-x}As$ layer, a type-N $Al_xGa_{1-x}As$ layer doped by $5.10^{16}$ to $10^{18}$ electrons/cm³ and of thickness between 500 and 1000 Å, a type-N, GaAs layer doped to less than $10^{16}$ electrons/cm³ and of thickness between 500 and 1000 Å, a type-N, GaAs layer, doped to $10^{17}$ to $5.10^{17}$ electrons/cm³ and of thickness between 500 and 1000 Å whereby the metal coatings for the source, drain and Schottky grid are deposited on the semiconductor surface.

* * * * *